(12) United States Patent
Wu et al.

(10) Patent No.: US 9,379,197 B1
(45) Date of Patent: Jun. 28, 2016

(54) RECESS ARRAY DEVICE

(71) Applicant: INOTERA MEMORIES, INC., Taoyuan (TW)

(72) Inventors: Tieh-Chiang Wu, Taoyuan (TW); Shing-Yih Shih, New Taipei (TW)

(73) Assignee: INOTERA MEMORIES, INC., Hwa-Ya Technology Park, Guishan Dist., Taoyuan (TW)

( * ) Notice: Subject to any disclaimer, the term of this patent is extended or adjusted under 35 U.S.C. 154(b) by 0 days.

(21) Appl. No.: 14/877,889

(22) Filed: Oct. 7, 2015

(51) Int. Cl.
| | |
|---|---|
| *H01L 29/66* | (2006.01) |
| *H01L 29/06* | (2006.01) |
| *H01L 29/423* | (2006.01) |
| *H01L 29/78* | (2006.01) |
| *H01L 27/108* | (2006.01) |

(52) U.S. Cl.
CPC ........ *H01L 29/42368* (2013.01); *H01L 27/108* (2013.01); *H01L 29/0649* (2013.01); *H01L 29/4236* (2013.01); *H01L 29/78* (2013.01)

(58) Field of Classification Search
CPC ....... H01L 29/06; H01L 29/66; H01L 29/513; H01L 29/517; H01L 29/518; H01L 29/407; H01L 29/7813; H01L 29/4236; H01L 29/66734; H01L 29/1095; H01L 29/0696; H01L 29/7802; H01L 29/41766; H01L 29/42368; H01L 27/10852; H01L 27/10817; H01L 28/91; H01L 28/87; H01L 23/367; H01L 23/467; H01L 23/4006; H01L 2023/405; H01L 2023/4031; H01L 29/66795
USPC ......... 257/401, 328, 329, 330, 331, 332, 333, 257/647, 324, 410, 411, 302, 308, 722
See application file for complete search history.

(56) References Cited

U.S. PATENT DOCUMENTS

| | | | |
|---|---|---|---|
| 2005/0156284 | A1 | 7/2005 | Schmidt |
| 2010/0240185 | A1 | 9/2010 | Sohn |
| 2014/0134808 | A1 | 5/2014 | Zhang |
| 2015/0221737 | A1* | 8/2015 | Liao .................. H01L 21/28114 257/288 |

* cited by examiner

*Primary Examiner* — Chuong A Luu
(74) *Attorney, Agent, or Firm* — Winston Hsu; Scott Margo

(57) ABSTRACT

A recess array device includes a semiconductor substrate and at least an active area in a main surface of the semiconductor substrate. A gate trench penetrates through the active area. The gate trench includes a first sidewall, a second sidewall facing the first sidewall, and a bottom surface extending between the first and the second sidewalls. A bump portion is disposed in the gate trench. The bump portion has two opposite sidewalls and a top portion extending between the two opposite sidewalls. A gate oxide layer is formed in the gate trench. The gate oxide layer has a first thickness on the first and second sidewalls, a second thickness on the two opposite sidewalls of the bump portion, and a third thickness on the top portion of the bump portion. The first thickness is greater than the second thickness. The second thickness is greater than the third thickness.

4 Claims, 5 Drawing Sheets

RECESS ARRAY DEVICE

BACKGROUND OF THE INVENTION

1. Field of the Invention

The present invention relates generally to a semiconductor device. More specifically, the present invention relates to a recess array device and a fabrication method thereof.

2. Description of the Prior Art

For years the trend in the memory industry as well as the semiconductor industry has been to scale down the size of memory cells in order to increase the integration level and thus the memory capacity of DRAM chips. As the cell density of memory devices increases, recess array devices that are formed in recesses in a semiconductor substrate are increasingly favored.

In general, the recess (or gate trench) formed in a substrate has opposing sidewalls and a bottom surface extending between the sidewalls. A gate oxide layer is formed in the recess. A gate structure is then deposited into the recess. Doped regions may then be formed in the main surface of the substrate to form source and drain regions.

The prior art recess array devices still have some drawbacks. For example, the prior art recess array devices is subject to higher gate-induced drain leakage (GIDL) currents in the vicinity of the overlap region between the gate and the drain region. GIDL current in the overlap region may be caused by band to band tunneling effects, and can impose significant operating limitations on thin-oxide cell devices and loss of retention time performance. Although the GIDL current in the overlap region can be alleviated by increasing the thickness of the gate oxide layer, the write back performance on the other hand would be compromised.

Therefore, there is a need in this industry to provide an improved recess array device that is capable of overcoming the above-mentioned shortcomings.

SUMMARY OF THE INVENTION

According to one aspect of the invention, a recess array device is provided. The recess array device includes a semiconductor substrate and at least an active area in a main surface of the semiconductor substrate. A trench isolation surrounds the active area in the main surface of the semiconductor substrate. At least one gate trench penetrates through the active area. The gate trench includes a first sidewall, a second sidewall facing the first sidewall, and a bottom surface extending between the first sidewall and the second sidewall. A bump portion is disposed at a bottom portion of the gate trench. The bump portion has two opposite sidewalls and a top portion extending between the two opposite sidewalls. The bottom surface includes surface of the top portion and surfaces of the two opposite sidewalls. A gate oxide layer is formed on the first sidewall, the second sidewall, and the bottom surface. The gate oxide layer has a first thickness on the first and second sidewalls, a second thickness on the two opposite sidewalls of the bump portion, and a third thickness on the top portion of the bump portion. The first thickness is greater than the second thickness. The second thickness is greater than the third thickness. A recess gate is disposed within the gate trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated.

Figure 1:
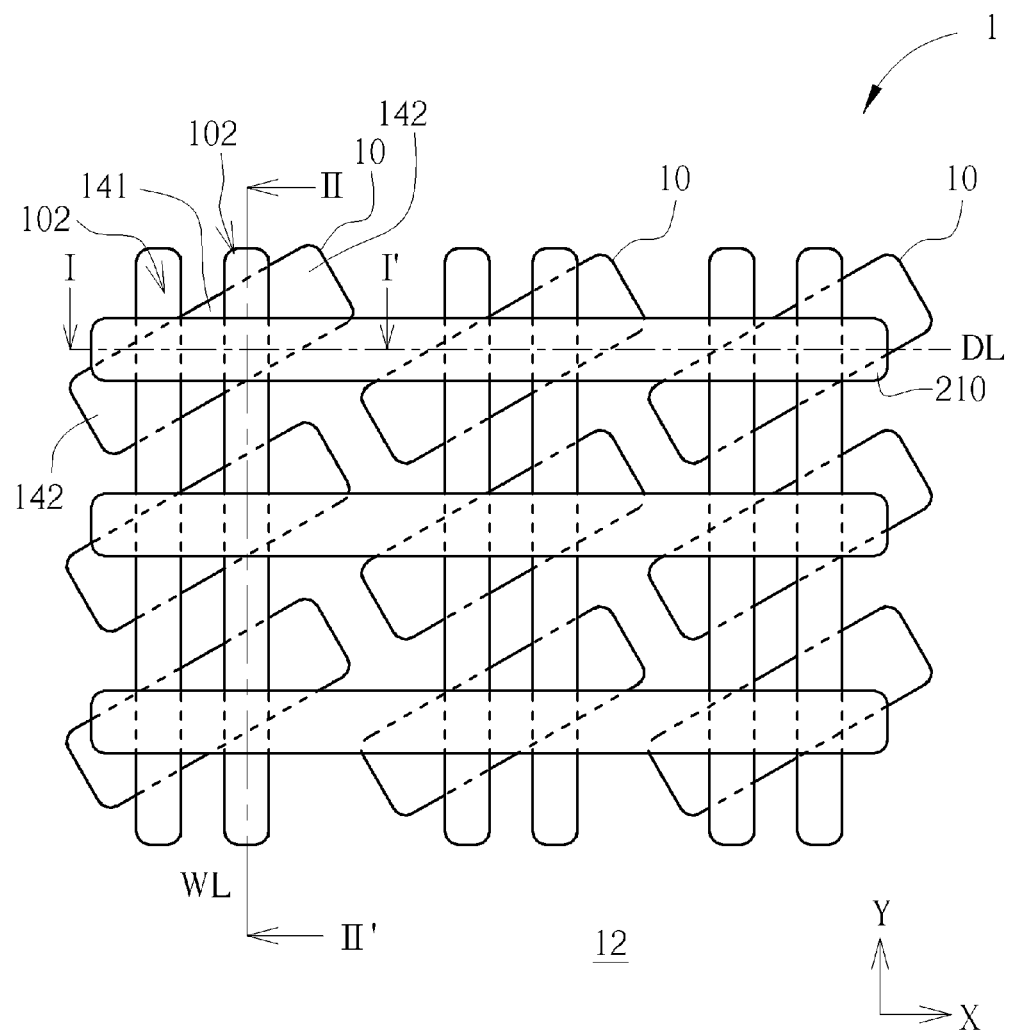
FIG. 1 is a plane view showing a portion of an exemplary memory cell array in accordance with one embodiment of the invention.
Figure 2A:
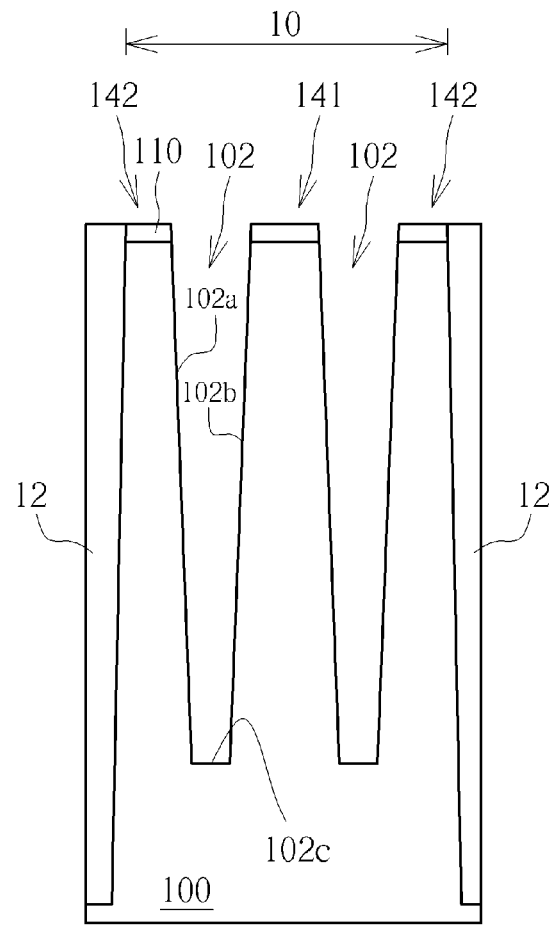
FIG. 2A and FIG. 2B are schematic, cross-sectional views taken along lines I-I' and line II-II' in FIG. 1 respectively.
Figure 2B:
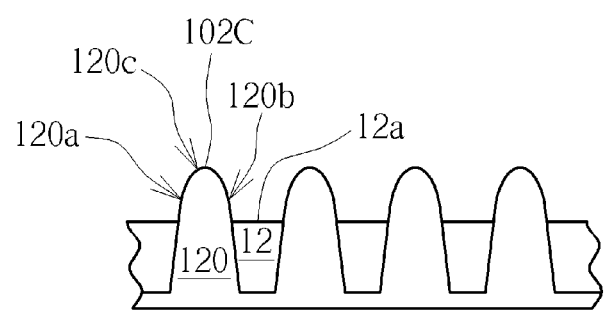
Figure 5:
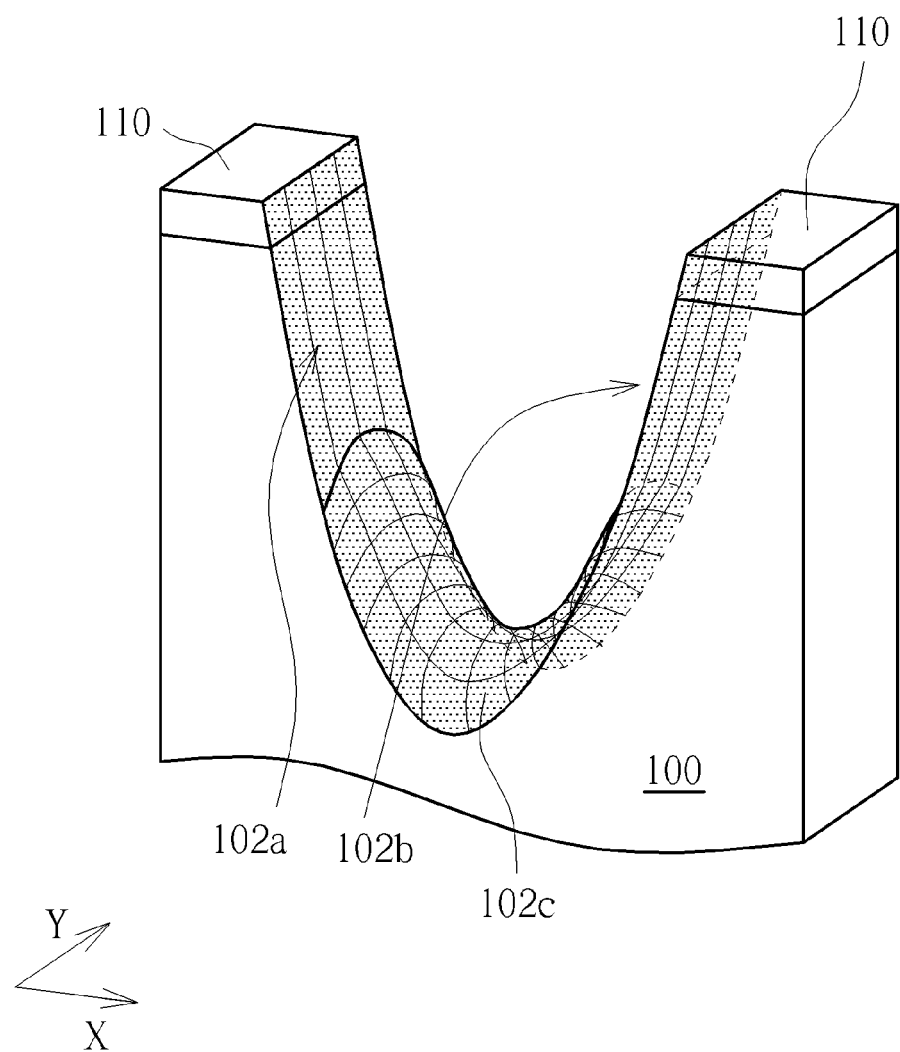
FIG. 5 is a perspective, three-dimensional diagram showing the saddle-shaped surface profile in the recess in accordance with one embodiment of the invention.

Please refer to FIG. 1, FIG. 2A, FIG. 2B, and FIG. 5. FIG. 1 is a plane view showing a portion of an exemplary memory cell array in accordance with one embodiment of the invention. FIG. 2A and FIG. 2B are schematic, cross-sectional views taken along lines I-I' and line II-II' in FIG. 1 respectively. FIG. 5 is a perspective, three-dimensional diagram showing the saddle-shaped surface profile in the recess in accordance with one embodiment of the invention. An exemplary method for fabricating a recess array device in accordance with one embodiment of the invention is illustrated.

First, as shown in FIG. 1, active areas 10 are disposed in a semiconductor substrate in matrix. Each of the active areas 10 is isolated and surrounded by a trench isolation structure 12. According to the illustrated embodiment, each of the active areas 10 is penetrated by two gate trenches 102 so that the each of the active areas 10 is divided into three regions including a common source region 141 between the two gate trenches 102 and two drain regions 142 disposed at two ends of each of the active areas 10.

The two gate trenches 102 extend along a first direction (reference y-axis) or wordline (WL) direction. Digitlines (DL) 210 overlying the main surface of the substrate are shown for illustration purposes only. These digitlines 210 extend along a second direction (reference x-axis) or digitline (DL) direction.

To form the gate trenches 102, a lithographic process and a dry etching process may be performed to etch through the hard mask 110 and into the semiconductor substrate 100 to a predetermined trench depth.

As shown in FIG. 2A, each gate trench 102 comprises a first sidewall 102a, a second sidewall 102b facing the first sidewall 102a, and a bottom surface 102c extending between the first sidewall 102a and the second sidewall 102b. As shown in FIG. 2B and FIG. 5, a bump portion 120 is formed at the bottom of each gate trench 102 to thereby provide a saddle-shaped surface profile in each gate trench 102. The bump portion 120 protrudes from a surface 12a of the trench isolation 12 and has two opposite, slightly curved sidewalls 120a and 120b. The bump portion 120 further has a top portion 120c extending between the two sidewalls 120a and 120b. The aforesaid bottom surface 102c includes the surface of the top portion 120c and the surfaces of the two sidewalls 120a and 120b.

Figure 3A:
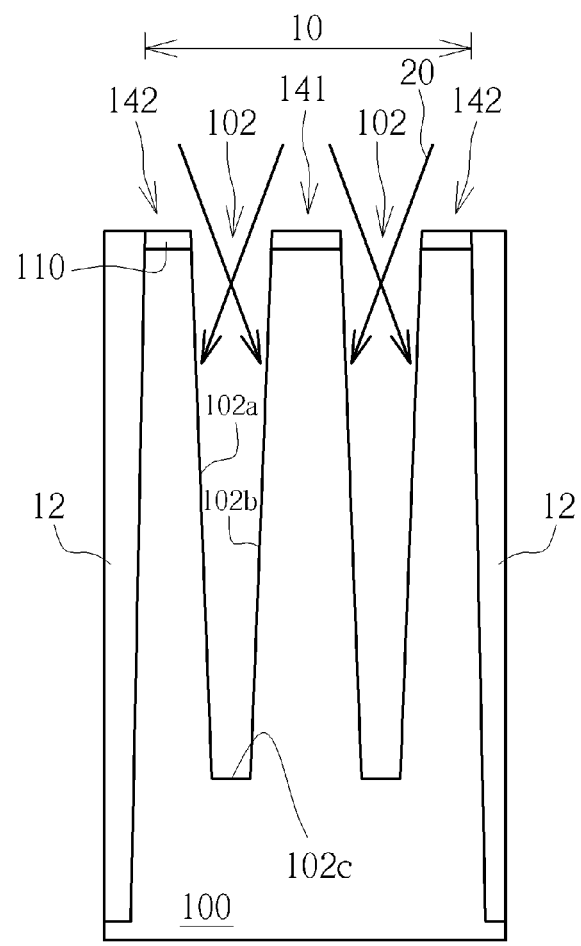
FIG. 3A and FIG. 3B are schematic, cross-sectional views taken along lines I-I' and line II-II' in FIG. 1 respectively, showing the gate oxide growth enhancement/suppression implant steps.
Figure 3B:
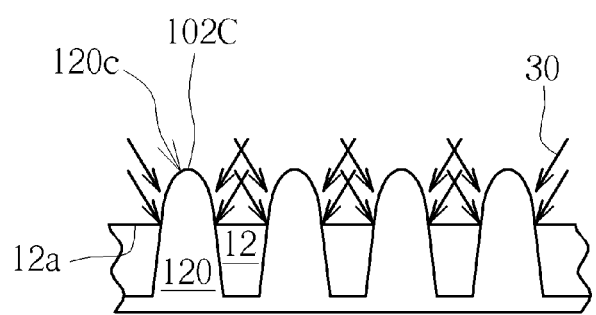
Figure 4A:
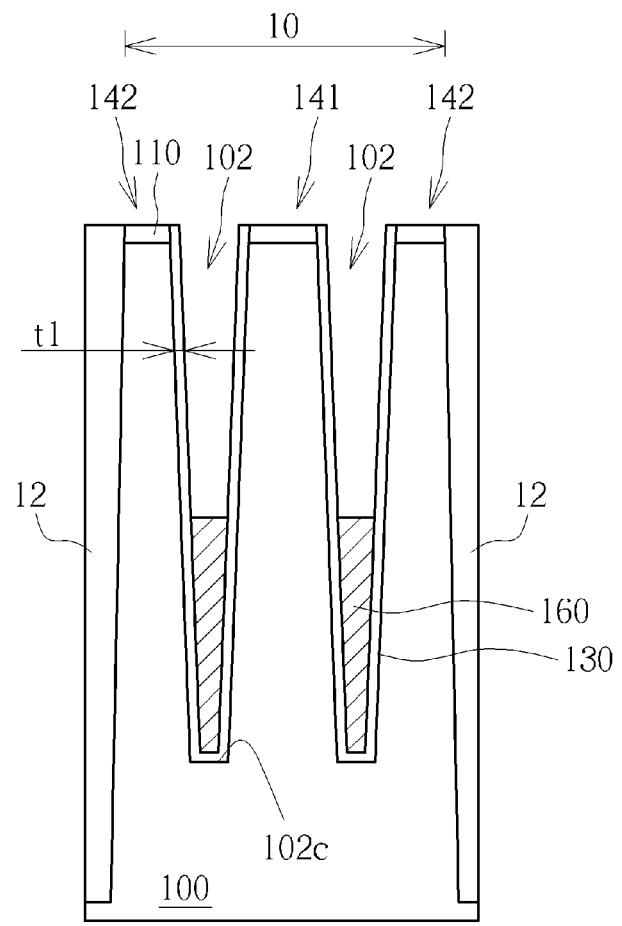
FIG. 4A and FIG. 4B are schematic, cross-sectional views taken along lines I-I' and line II-II' in FIG. 1 respectively, showing the gate oxide growth in different thicknesses.
Figure 4B:
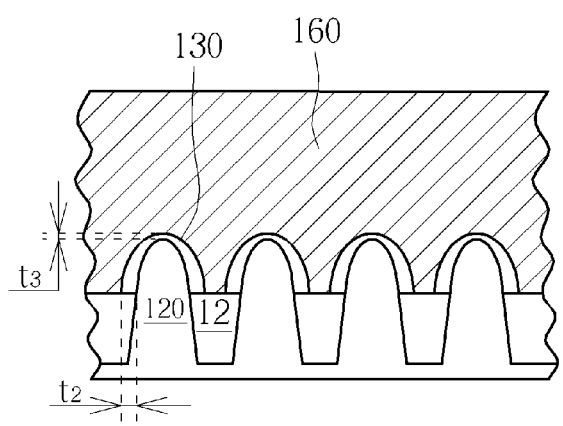

As shown in FIGS. 3A and 3B, after forming the gate trenches 102, an oxide growth enhancement implant 20 may be performed to implant halogen impurities at a designated angle along the DL direction into the first sidewall 102a and the second sidewall 102b. By adjusting the tilt angle of the gate oxide growth enhancement implant 20, the halogen impurities such as fluorine (F) may be implanted only into an upper portion of the first sidewall 102a and the second sidewall 102b. The halogen impurities such as fluorine (F) accelerate the growth of a silicon oxide layer.

Alternatively, an oxide growth suppression implant 30 may be performed to implant impurities such as nitrogen atoms into the top portion 120c and the sidewalls 120a and 120b of the bump portion 120 along the WL direction. The nitrogen atoms retard the growth of a silicon oxide layer. In some embodiments, both of the oxide growth enhancement implant 20 and the oxide growth suppression implant 30 may be performed.

After the oxide growth enhancement implant 20 or the oxide growth suppression implant 30 is completed, an oxidation process is carried out to grow a gate oxide layer 130 in each gate trench 102. The gate oxide layer 130 has at least three different thicknesses: thickness t1 on the sidewall 102a and 102b, thickness t2 on the sidewalls 120a and 120b, and thickness t3 on the top portion 120c of the bump portion 120. Since the halogen impurities accelerate the growth of the silicon oxide layer, thickness t1 on the sidewall 102a and 102b of the gate oxide layer 130 is greater than the thickness t2 on the sidewalls 120a and 120b, and the thickness t2 on the sidewalls 120a and 120b is greater than the thickness t3 on the top portion 120c of the bump portion 120 (t1>t2>t3). After forming the gate oxide layer 130, a recess gate 160 may be formed within each gate trench 102.

Since the gate oxide layer 130 has a thinner thickness t3 at the top portion 120c of the bump portion 120, the write back performance may be improved. The thicker gate oxide layer 130 at the sidewall 102a and 102b can alleviate the GIDL current in the overlap region between the gate 160 and the drain region 142.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A recess array device, comprising:
a semiconductor substrate;
at least an active area in a main surface of the semiconductor substrate;
a trench isolation surrounding the active area in the main surface of the semiconductor substrate;
at least one gate trench extending into the semiconductor substrate, wherein the gate trench includes a first sidewall, a second sidewall facing the first sidewall, and a bottom surface extending between the first sidewall and the second sidewall;
a bump portion of the semiconductor substrate protruding from a bottom surface of the gate trench, wherein the bump portion has two opposite sidewalls and a top portion extending between the two opposite sidewalls, wherein the bottom surface includes surface of the top portion and surfaces of the two opposite sidewalls;
a gate oxide layer on the first sidewall, the second sidewall, and the bottom surface of the gate trench, wherein the gate oxide layer has a first thickness on the first and second sidewalls, a second thickness on the two opposite sidewalls of the bump portion, and a third thickness on the top portion of the bump portion, wherein the first thickness is greater than the second thickness, and the second thickness is greater than the third thickness; and
a recess gate disposed within the gate trench.

2. The recess array device according to claim 1 further comprising a source region in the active area on one side of the gate trench and a drain region in the active area on the other side of the gate trench.

3. The recess array device according to claim 1 wherein the first sidewall, the second sidewall, and the bottom surface form a saddle-shaped surface profile in the gate trench.

4. The recess array device according to claim 1 wherein the gate trench extends along a wordline direction.

* * * * *